(12) United States Patent
Xu

(10) Patent No.: US 11,977,304 B2
(45) Date of Patent: May 7, 2024

(54) DISPLAY PANEL AND DISPLAY DEVICE

(71) Applicant: Shenzhen China Star Optoelectronics Semiconductor Display Technology Co., Ltd., Shenzhen (CN)

(72) Inventor: Sen Xu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/973,479

(22) PCT Filed: Nov. 25, 2020

(86) PCT No.: PCT/CN2020/131416
§ 371 (c)(1),
(2) Date: Dec. 9, 2020

(87) PCT Pub. No.: WO2022/104856
PCT Pub. Date: May 27, 2022

(65) Prior Publication Data
US 2023/0273486 A1    Aug. 31, 2023

(30) Foreign Application Priority Data

Nov. 17, 2020 (CN) .......................... 202011285670.4

(51) Int. Cl.
*G02F 1/1362* (2006.01)
*G02F 1/1343* (2006.01)
*H01L 27/12* (2006.01)

(52) U.S. Cl.
CPC .. *G02F 1/136286* (2013.01); *G02F 1/134345* (2021.01); *G02F 1/136218* (2021.01); *G02F 1/136222* (2021.01); *H01L 27/124* (2013.01)

(58) Field of Classification Search
CPC ............ H01L 27/124; G02F 1/134345; G02F 1/136222; G02F 1/136286; G02F 1/136218

See application file for complete search history.

(56) References Cited

U.S. PATENT DOCUMENTS

| 2014/0085583 A1 | 3/2014 | Lu et al. |
| 2015/0153618 A1 | 6/2015 | Hao |
| 2015/0268517 A1 | 9/2015 | Song |
| 2016/0062190 A1 | 3/2016 | Shin |

(Continued)

FOREIGN PATENT DOCUMENTS

| CN | 105319792 A | * 2/2016 |
| CN | 105470269 A | 4/2016 |

(Continued)

*Primary Examiner* — Hoan C Nguyen
(74) *Attorney, Agent, or Firm* — Nathan & Associates; Menachem Nathan

(57) ABSTRACT

The present disclosure provides a display panel and a display device. The display panel includes a plurality of sub-pixels. The sub-pixel includes a first common electrode wiring, a second common electrode wiring, a first connecting line, a second connecting line, and a pixel electrode. A sub-pixel structure of the present disclosure uses a new common electrode wiring design, and since a position of an electrode stem in the pixel electrode itself is a dark area, the first common electrode wiring is disposed below the electrode stem, so as to reduce a shadow and increase penetration rate.

12 Claims, 3 Drawing Sheets

(56) References Cited

U.S. PATENT DOCUMENTS

2017/0023833 A1\* 1/2017 No .................... G02F 1/134309
2019/0227399 A1\* 7/2019 Shin ................. G02F 1/134309

FOREIGN PATENT DOCUMENTS

| | | | | | |
|---|---|---|---|---|---|
| CN | 106873238 | A | \* | 6/2017 | ........... G02F 1/1333 |
| CN | 107238990 | A | | 10/2017 | |
| CN | 107272232 | A | | 10/2017 | |
| CN | 107329339 | A | | 11/2017 | |
| CN | 107479271 | A | | 12/2017 | |
| CN | 207268838 | U | | 4/2018 | |
| CN | 108594545 | A | \* | 9/2018 | ....... G02F 1/134309 |
| CN | 109634012 | A | | 4/2019 | |
| CN | 110174787 | A | \* | 8/2019 | ......... G02F 1/13306 |
| CN | 110346995 | A | | 10/2019 | |
| TW | 201500778 | A | \* | 1/2015 | |

\* cited by examiner

DISPLAY PANEL AND DISPLAY DEVICE

FIELD OF INVENTION

The present disclosure relates to a field of display technology, particularly to a display panel with ultra-narrow border and a display device.

DESCRIPTION OF PRIOR ART

In an existing liquid crystal display pixel design, a storage capacitor can use an upper row scan line of a pixel as a potential reference electrode. This technical solution is generally called Cst on gate, namely, a pixel electrode coincides with a scan line.

As shown in FIG. 1, if a lower plate common electrode design is the same as a traditional Cst on COM design (the lower plate common electrode serving as the potential reference electrode), a common electrode wiring (Acom wiring) adopts a ring-shaped peripheral sealing design, which will reduce aperture ratio of the pixel electrode. If a single-sided Acom wiring design is used and the single-sided Acom wiring is broken, it will affect liquid crystal alignment. Using a non-Acom wiring design will cause a problem that prevents darkening in a subsequent manufacturing process, which will affect a display effect of a panel.

Therefore, it is necessary to provide a display panel which uses a new Acom wiring design, which is able to reduce aperture ratio of the pixel electrode.

SUMMARY

A purpose of the present disclosure is to provide a display panel, a first common electrode wiring is disposed below an electrode stem, which is able to reduce a shadow and increase penetration rate.

The present disclosure provides a display panel, the display panel includes a plurality of sub-pixels, and the sub-pixels are arranged in an array; the sub-pixel includes a first common electrode wiring; a pixel electrode, and the pixel electrode includes a first electrode stem and a second electrode stem disposed perpendicular to each other; wherein, the first common electrode wiring is disposed below the first electrode stem.

Further, the sub-pixel also includes a second common electrode wiring disposed at a corner of the sub-pixel, and is connected to the first common electrode wiring by a first connecting line.

Further, the sub-pixel also includes a second connecting line, one end of the second connecting line is connected to the second common electrode wiring, and another end extends to an adjacent sub-pixel along a peripheral of the sub-pixel.

Further, the sub-pixel also includes a thin film transistor disposed diagonally across a corner of the sub-pixel.

Further, the sub-pixel also includes a scan line disposed below the pixel electrode and connected to the thin film transistor.

Further, at the second common electrode wiring, a cross section of the sub-pixel includes a first metal layer, and the second common electrode wiring is formed in the first metal layer; a first insulating layer disposed on the first metal layer; an active layer disposed on the first insulating layer; a second metal layer disposed on the active layer; a second insulating layer disposed on the active layer and the first insulating layer, the second insulating layer defines a first slot, which is concave and extends downward to an upper surface of the second metal layer; a color resistance layer disposed on the second insulating layer, and the color resistance layer defines a second slot, which is concave and extends downward to an upper surface of the second insulating layer; a third insulating layer disposed on the color resistance layer, and the third insulating layer defines a third slot corresponding to the first slot, and the first slot is connected to the third slot; and a transparent electrode layer disposed in the second slot and the first slot.

Further, the first common electrode wiring, the first connecting line, and the second common electrode wiring are prepared on a same metal layer.

Further, the first common electrode wiring, the first connecting line, the second common electrode wiring and the second connecting line are prepared on a same metal layer.

Further, the first common electrode wiring and the scan line are prepared on a same layer.

Further, at the thin film transistor, a layered structure of the sub-pixel includes a gate layer; a first insulating layer disposed on the gate layer; an active layer disposed on the first insulating layer; a second metal layer disposed on the active layer; a second insulating layer disposed on the active layer, the second metal layer, and the first insulating layer; a color resistance layer disposed on the second insulating layer, a third insulating layer disposed on the color resistance layer.

Beneficial effects of the present disclosure are as follows: the present disclosure provide the display panel, which uses a new common electrode wiring design, since a position of the electrode stem in the pixel electrode itself is a dark area, the first common electrode wiring is disposed below the electrode stem, so as to reduce a shadow and increase penetration rate. And a pattern of the pixel electrode of the second common electrode wiring is an ITO pattern that shields electric field to prevent light leakage, which is able to prevent light leakage from the second common electrode wiring.

DESCRIPTION OF DRAWINGS

The embodiments of the present disclosure will be described hereinafter with reference to the accompanying drawings, the technical solutions and the beneficial effects of the present disclosure will be obviously.

DETAILED DESCRIPTION OF EMBODIMENTS

The specific structures and functional details disclosed herein are only representative, and are used for the purpose of describing exemplary embodiments of the present disclosure. However, the present disclosure can be implemented in many alternative forms, and should not be interpreted as merely limited by the embodiments described herein.

In the descriptions of the present disclosure, the terms "center", "longitudinal", "lateral", "length", "width", "thickness", "upper", "lower", "front", "back", "left", "right", "vertical", "horizontal", "top", "bottom", "inner", "outer", "clockwise", "counterclockwise" directions, and other indicated directions or the position relation are based on the orientation or position relation shown in the figures, only for convenience of describing the present disclosure and the simplification of the description, rather than indicating or implying that the means or elements referred to have a specific orientation, so that the above directions of the present disclosure cannot be understood as limitations. In addition, the terms "first" and "second" are used only for purposes of description, and cannot be understood to indicate or imply a relative importance or to implicitly indicate the number of technical features indicated. Thus, the features "first" and "second" can be expressly or implicitly included in one or more of the features. In the description of the present disclosure, the meanings of "multiple" are two or more, unless specifically limited otherwise. In addition, the term "include" and any of its variants are intended to cover non-exclusive inclusions.

Figure 1:
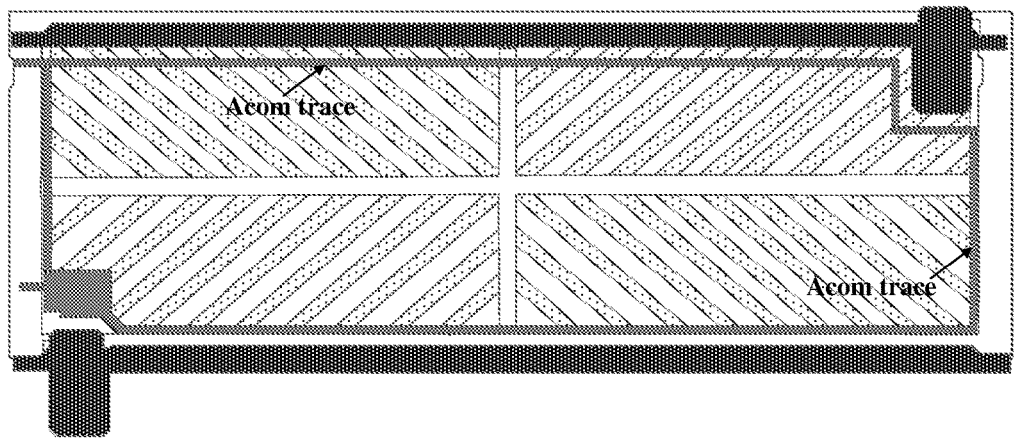
FIG. 1 is a structural schematic diagram of a sub-pixel in prior art.
Figure 2:
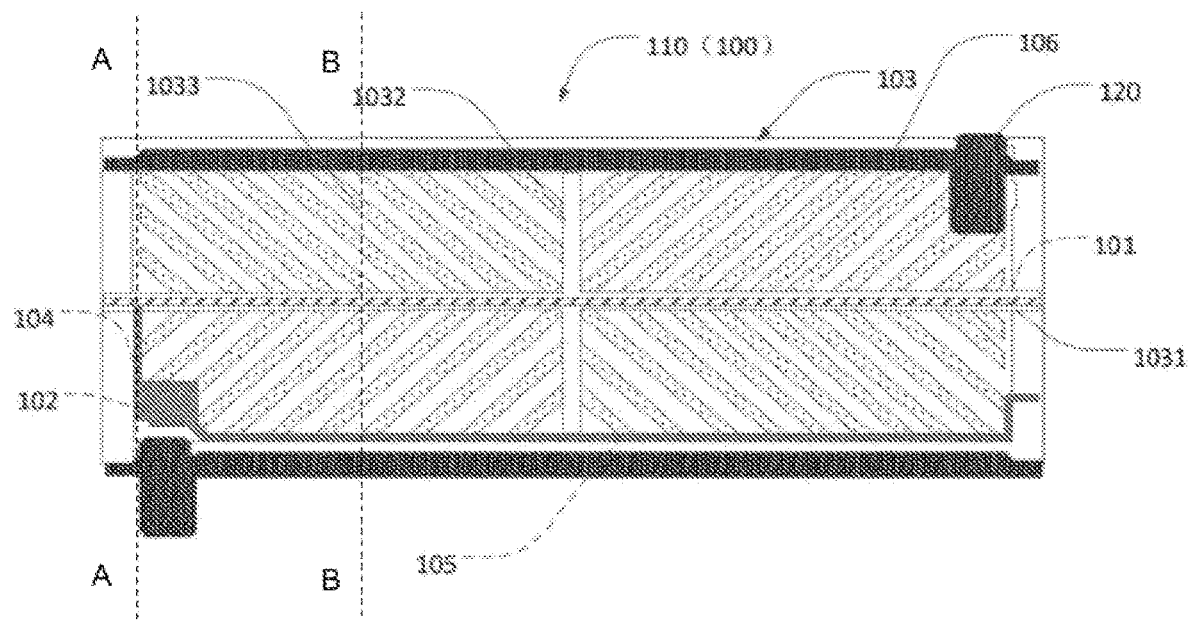
FIG. 2 is a structural schematic diagram of a sub-pixel provided by the present disclosure.

As shown in FIG. 2, the present disclosure provides a display panel 100 which includes a plurality of sub-pixels 110, and the sub-pixels 110 are arranged in an array.

The sub-pixel 110 includes a first common electrode wiring 101, a second common electrode wiring 102, a first connecting line 104, a second connecting line 105 and a pixel electrode 103.

The pixel electrode 103 includes a first electrode stem 1031 and a second electrode stem 1032 disposed perpendicular to each other. The first electrode stem 1031 vertically bisects the second electrode stem 1032.

A material of the pixel electrode 103 includes indium tin oxide.

The pixel electrode 103 also includes electrode branches 1033, which are respectively and obliquely connected to the first electrode stem 1031 and the second electrode stem 1032.

The pixel electrode 103 has four domains, the electrode branches 1033 in different domains are symmetrical to the first electrode stem 1031 and the second electrode stem 1032.

The first common electrode wiring 101 is disposed below the first electrode stem 1031.

The second common electrode wiring 102 is disposed at a corner of the sub-pixel 110 and is connected to the first common electrode wiring 101 by the first connecting line 104.

A transparent electrode layer is disposed on the second common electrode wiring 102. A pattern of the pixel electrode 103 is an ITO pattern that shields electric field to prevent light leakage, which is able to prevent light leakage from the second common electrode wiring 102.

In this embodiment, the transparent electrode layer can be divided into two types of electrical signals, namely pixel electrode and data shading (data BM less, DBS).

The first electrode stem 1031/the second electrode stem 1032/the electrode branches 1033 can be collectively referred to as the pixel electrode, so the pixel electrode is used to control liquid crystal deflection to control the amount of light transmission, so that a panel shows different brightness.

The DBS is completely separated from the pixel electrode. The DBS is a special electrode pattern. The DBS is used to shield light, and although the DBS and the pixel electrode are both electrode patterns, electrical signals given are different; if connected, a short circuit will occur, so a gap will appear at a position of the second common electrode wiring 102. The gap is exactly where the light leaks. In the present disclosure, the second common electrode wiring 102 is used to pass through the gap, and since the second common electrode wiring 102 is made of metal, it is itself opaque and can therefore shield light from light source to achieve a purpose of shielding light leakage.

The present disclosure uses a new common electrode wiring design. Since a position of an electrode stem in the pixel electrode 103 itself is a dark area, the first common electrode wiring 101 is disposed below the electrode stem, so as to reduce a shadow and increase penetration rate.

One end of the second connecting line 105 is connected to the second common electrode wiring 102, and another end extends to an adjacent sub-pixel 110 along a peripheral of the sub-pixel 110.

The first common electrode wiring 101, the second common electrode wiring 102, a scan line 106, the first connecting line 104 and the second connecting line 105 are formed in a first metal layer 112.

In an embodiment, a sub-pixel 110 also includes a thin film transistor 120 and a scan line 106.

The thin film transistor 120 is disposed diagonally across a corner of the sub-pixel 110.

The scan line 106 is disposed below the pixel electrode 103 and connected to the thin film transistor 120.

Figure 3:
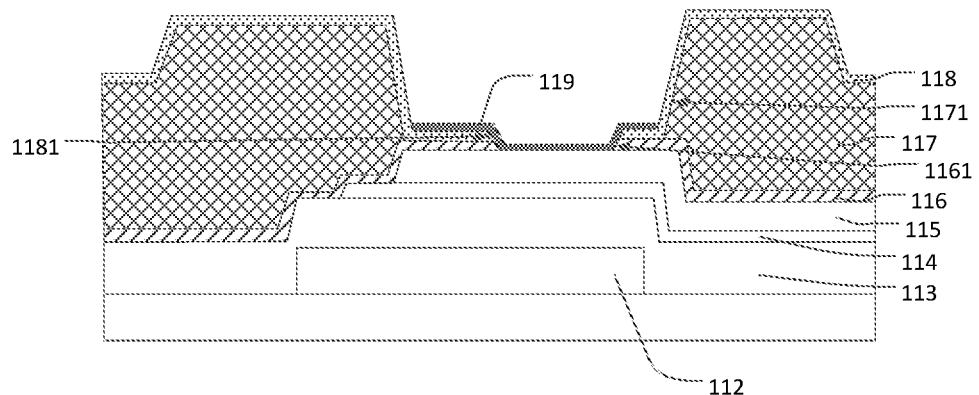
FIG. 3 is a sectional view of a second common electrode wiring in FIG. 2 of the present disclosure.

As shown in FIG. 3, at the second common electrode wiring 102, a cross section of the sub-pixel 110 includes the first metal layer 112, a first insulating layer 113, an active layer 114, a second metal layer 115, a second insulating layer 116, a color resistance layer 117, a third insulating layer 118, and a transparent electrode layer 119.

The second common electrode wiring 102 is formed in the first metal layer 112. The first insulating layer 113 is disposed on the first metal layer 112. The active layer 114 is disposed on the first insulating layer 113.

The second metal layer 115 is disposed on the active layer 114. The second insulating layer 116 is disposed on the active layer 114 and the first insulating layer 113. The second insulating layer 116 defines a first slot 1161, which is concave and extends downward to an upper surface of the second metal layer 115.

The color resistance layer 117 is disposed on the second insulating layer 116. The color resistance layer 117 defines a second slot 1171 which is concave and extends downward to an upper surface of the second insulating layer 116. The color resistance layer 117 is R/G/B color resistance. Positions of the first slot 1161 and the second slot 1171 are overlapped; that is, during preparation, the second slot 1171 is first opened, and then the first slot 1161 is opened at bottom of the second slot 1171.

The third insulating layer 118 is disposed on the color resistance layer 117. The third insulating layer 118 defines a third slot 1181 corresponding to the first slot 1161. The first slot 1161 is connected to the third slot 1181.

The transparent electrode layer 119 is disposed in the second slot 1171 and the first slot 1161. A pattern of the transparent electrode layer 119 here is an ITO pattern that shields electric field to prevent light leakage, which is able to prevent light leakage from the second common electrode 102. In an embodiment, the transparent electrode layer 119 is used to connect the pixel electrode 103 and the second metal layer 115.

The patterned transparent electrode layer 119 is the pixel electrode 103.

In an embodiment, the first common electrode wiring 101, the first connecting line 104, and the second common electrode wiring 102 are prepared on a same metal layer.

In an embodiment, the first common electrode wiring 101, the first connecting line 104, the second common electrode wiring 102, and the second connecting line 105 are prepared on a same metal layer.

In an embodiment, the first common electrode wiring 101 and the scan line 106 are prepared on a same layer.

Figure 4:
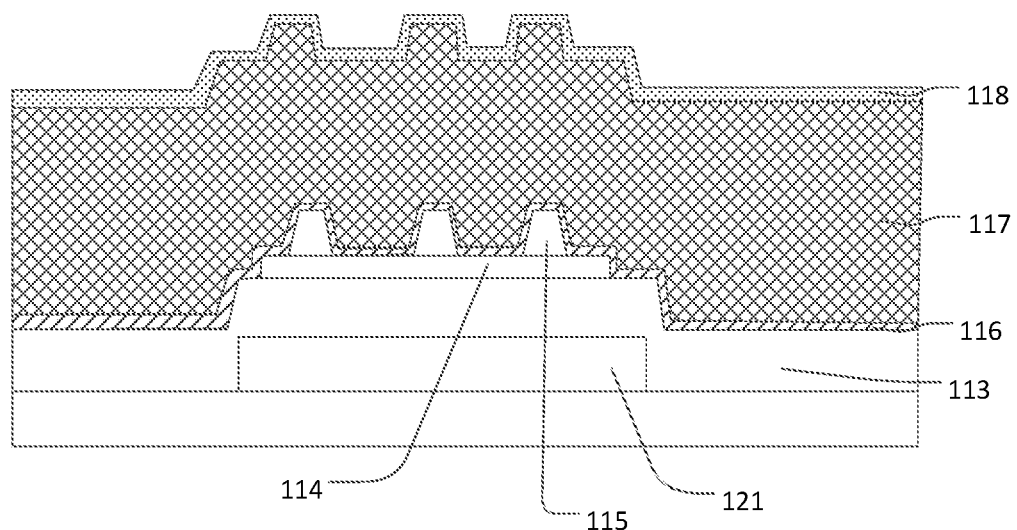
FIG. 4 is a sectional view of a thin film transistor in FIG. 2 of the present disclosure.
Figure 5:
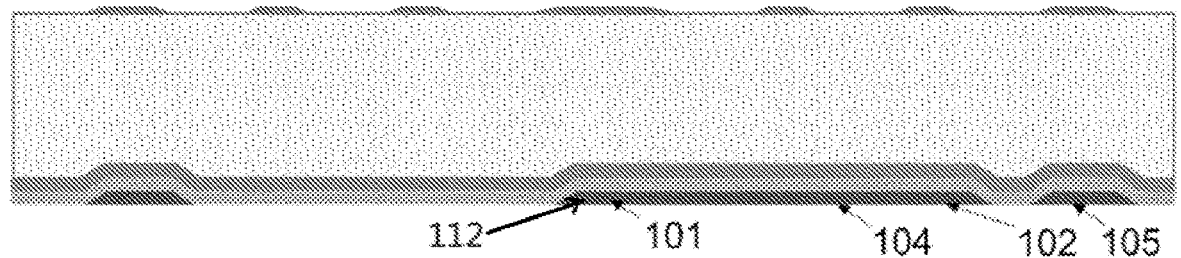
FIG. 5 is a cross-sectional view along A-A in FIG. 2 of the present disclosure.
Figure 6:
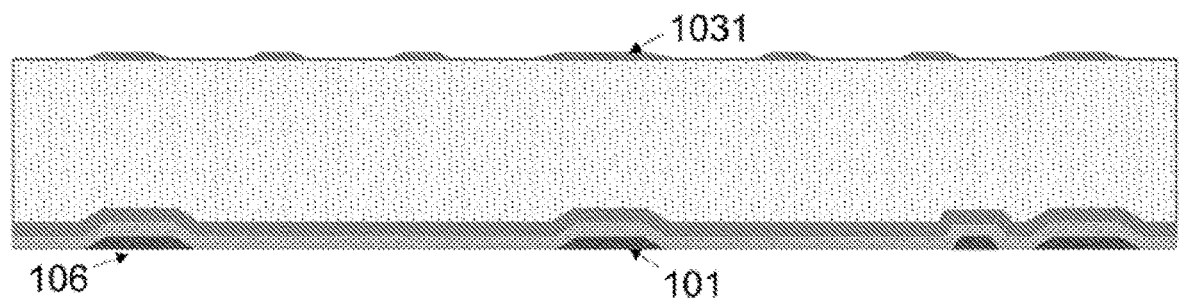
FIG. 6 is a cross-sectional view along B-B in FIG. 2 of the present disclosure.

As shown in FIG. 4, at the thin film transistor 120, a layered structure of the sub-pixel 110 includes a gate layer 121, a first insulating layer 113, an active layer 114, a second metal layer 115, a second insulating layer 116, a color resistance layer 117, and a third insulating layer 118.

The first insulating layer 113 is disposed on the gate layer 121. The active layer 114 is disposed on the first insulating layer 113.

The second metal layer 115 is disposed on the active layer 114. The second insulating layer 116 is disposed on the active layer 114, the second metal layer 115, and the first insulating layer 113.

The color resistance layer 117 is disposed on the second insulating layer 116; the third insulating layer 118 is disposed on the color resistance layer 117.

The present disclosure further provides a display device. The display device includes the display panel of the present disclosure.

In summary, although the priority embodiments above have been disclosed in the present disclosure, the above priority embodiments are not intended to limit the present disclosure, those of ordinary skill in the art can make various changes and modifications without departing from the spirit and scope of the present disclosure, so the scope of protection of the present disclosure is subject to the scope defined in claims.

What is claimed is:

1. A display panel, comprising: a plurality of sub-pixels, and the sub-pixels are arranged in an array, wherein the sub-pixel comprises:
   a first common electrode wiring;
   a pixel electrode comprising a first electrode stem and a second electrode stem disposed perpendicular to each other;
   a second common electrode wiring disposed at a corner of the sub-pixel and connected to the first common electrode wiring by a first connecting line; and
   a second connecting line, one end of the second connecting line is connected to the second common electrode wiring, and another end extends to an adjacent sub-pixel along a peripheral of the sub-pixel,
   wherein the first common electrode wiring is disposed below the first electrode stem, and the first common electrode wiring, the first connecting line, the second common electrode wiring, and the second connecting line are prepared on a same metal layer.

2. The display panel of claim 1, wherein the sub-pixel further comprises:
   a thin film transistor disposed diagonally across a corner of the sub-pixel.

3. The display panel of claim 2, wherein at the thin film transistor, a layered structure of the sub-pixel comprises:
   a gate layer;
   a first insulating layer disposed on the gate layer;
   an active layer disposed on the first insulating layer;
   a second metal layer disposed on the active layer;
   a second insulating layer disposed on the active layer, the second metal layer, and the first insulating layer;
   a color resistance layer disposed on the second insulating layer; and
   a third insulating layer disposed on the color resistance layer.

4. The display panel of claim 1, wherein the sub-pixel further comprises:
   a scan line disposed below the pixel electrode and connected to a thin film transistor.

5. The display panel of claim 4, wherein the first common electrode wiring and the scan line are prepared on a same layer.

6. The display panel of claim 1, wherein at the second common electrode wiring, a cross section of the sub-pixel comprises:
   a first metal layer, and the second common electrode wiring is formed in the first metal layer;
   a first insulating layer disposed on the first metal layer;
   an active layer disposed on the first insulating layer;
   a second metal layer disposed on the active layer;
   a second insulating layer disposed on the active layer and the first insulating layer, the second insulating layer defines a first slot, which is concave and extends downward to an upper surface of the second metal layer;
   a color resistance layer disposed on the second insulating layer; the color resistance layer defines a second slot, which is concave and extends downward to an upper surface of the second insulating layer;
   a third insulating layer disposed on the color resistance layer, the third insulating layer defines a third slot corresponding to the first slot, and the first slot is connected to the third slot; and
   a transparent electrode layer disposed in the second slot and the first slot.

7. A display device, comprising: a display panel, wherein the display panel comprises a plurality of sub-pixels, and the sub-pixels are arranged in an array, wherein the sub-pixel comprises:
   a first common electrode wiring;
   a pixel electrode comprising a first electrode stem and a second electrode stem disposed perpendicular to each other;
   a second common electrode wiring disposed at a corner of the sub-pixel and connected to the first common electrode wiring by a first connecting line; and
   a second connecting line, one end of the second connecting line is connected to the second common electrode wiring, and another end extends to an adjacent sub-pixel along a peripheral of the sub-pixel,
   wherein the first common electrode wiring is disposed below the first electrode stem, and the first common electrode wiring, the first connecting line, the second common electrode wiring, and the second connecting line are arranged on a same metal layer.

8. The display device of claim 7, wherein the sub-pixel further comprises:
   a thin film transistor disposed diagonally across a corner of the sub-pixel.

9. The display device of claim 8, wherein at the thin film transistor, a layered structure of the sub-pixel comprises:
   a gate layer;
   a first insulating layer disposed on the gate layer;
   an active layer disposed on the first insulating layer;
   a second metal layer disposed on the active layer;
   a second insulating layer disposed on the active layer, the second metal layer, and the first insulating layer;
   a color resistance layer disposed on the second insulating layer; and
   a third insulating layer disposed on the color resistance layer.

10. The display device of claim 7, wherein the sub-pixel further comprises:
- a scan line disposed below the pixel electrode and connected to a thin film transistor.

11. The display device of claim 10, wherein the first common electrode wiring and the scan line are prepared on a same layer.

12. The display device of claim 7, wherein at the second common electrode wiring, a cross section of the sub-pixel comprises:
- a first metal layer, and the second common electrode wiring is formed in the first metal layer;
- a first insulating layer disposed on the first metal layer;
- an active layer disposed on the first insulating layer;
- a second metal layer disposed on the active layer;
- a second insulating layer disposed on the active layer and the first insulating layer, the second insulating layer defines a first slot, which is concave and extends downward to an upper surface of the second metal layer;
- a color resistance layer disposed on the second insulating layer, and the color resistance layer defines a second slot, which is concave and extends downward to an upper surface of the second insulating layer;
- a third insulating layer disposed on the color resistance layer, and the third insulating layer defines a third slot corresponding to the first slot, and the first slot is connected to the third slot; and
- a transparent electrode layer disposed in the second slot and the first slot.

\* \* \* \* \*